United States Patent [19]

Benz et al.

[11] Patent Number: 5,866,852
[45] Date of Patent: Feb. 2, 1999

[54] CIRCUITIZED SUBSTRATE ASSEMBLY WITH CARRIER HAVING SUBSTRATES THEREIN

[75] Inventors: Gerhard Benz, Gärtringen; Jürgen Finze, Neuhengstett; Manfred Walker, Aidlingen, all of Germany

[73] Assignee: International Business Machines Corporation, Armonk, N.Y.

[21] Appl. No.: 779,873

[22] Filed: Jan. 6, 1997

[30]     Foreign Application Priority Data

Jan. 12, 1996 [DE]  Germany ................... 196 00 928.6

[51] Int. Cl.$^6$ ........................................................ H05K 1/03
[52] U.S. Cl. .................... 174/255; 361/801; 361/802; 361/759; 361/809; 206/707
[58] Field of Search ............................... 174/255, 250, 174/52.1; 361/801, 802, 732, 740, 747, 759, 807, 809, 810; 206/707, 706, 708

[56]        References Cited

U.S. PATENT DOCUMENTS 4,520,428  5/1985  Lusk ........................................ 361/399
5,394,609  3/1995  Ferguson et al. ......................... 29/840
5,642,265  6/1997  Bond et al. .............................. 361/809

FOREIGN PATENT DOCUMENTS

3113031 A1  1/1981  Germany .

*Primary Examiner*—Bot Ledynh
*Assistant Examiner*—Hung V Ngo
*Attorney, Agent, or Firm*—Ratner & Prestia; Lawrence R. Fraley, Esq.

[57]            ABSTRACT

An assembly of several circuitized substrates, e.g., printed circuit boards, frictionally retained within a common carrier. Tabs on the carrier engage slots in each substrate to align the substrates with respect to the carrier. At least one pair of male projections on each substrate frictionally engage female retaining members in the carrier to lock each substrate with respect to the carrier. The assembly is thus adapted for subsequent processing (e.g., electronic component attach) of the substrates while assuring substrate retention. Subsequently, the substrates can be readily separated (removed) from the carrier. The carrier can be of metal or recyclable plastic material.

9 Claims, 1 Drawing Sheet

CIRCUITIZED SUBSTRATE ASSEMBLY WITH CARRIER HAVING SUBSTRATES THEREIN

TECHNICAL FIELD

The present invention relates to devices for handling circuitized substrates (e.g., printed circuit boards), and also relates to a method for the manufacture of such a device and the positioning of such substrates therein to form a completed assembly.

BACKGROUND OF THE INVENTION

Circuitized substrates such as printed circuit boards and ceramic modules are typically made of organic (e.g., fiberglass-reinforced epoxy resin, also referred to as "FR4") and inorganic (e.g., alumina) materials, respectively. Such structures typically also include layers of internal and/or external wiring, also referred to as power, ground and/or signal planes. These substrates thus serve as mechanical carriers for electronic components, enabling these components to be connected electrically thereto and to each other, if desired.

While initial electronic components only had a relatively few connection terminals (referred to as I/Os, or Input/ Output terminals), and only some of these I/O terminals were interconnected, the number and density of the terminals have increased significantly with the rise in level of integration of modern semiconductor components, such as microprocessors or logic chips.

Printed circuit boards and other substrates have been assembled with, on occasion, several (e.g., hundreds) individual components, the applications of these printed circuit boards and substrates ranging from use within consumer electronics to typically larger assemblies such as mainframe computers.

Printed circuit board assemblies are known which include a so-called "work panel" or "work holder" containing several individual boards secured thereto. One example is described in U.S. Pat. No. 5,394,609, assigned to the same assignee as the present invention, wherein a plurality of boards are locked onto a work holder using V-shaped clamps that extend into cooperating apertures in the work holder. In the printed circuit board industry, when manufacturing preliminary products (unpopulated boards) in the format in which these are then supplied to customers (e.g., for component population), it is known to make the work panel frame from the same material used to produce the boards. Such a work panel therefore comprises a frame or the like structure on which the individual boards are positioned and eventually removed (e.g., once component population has occurred).

As discussed in DE-A-31 13 031, at least one printed circuit board is punched out of a material panel and the remaining part is then used as a carrier for the punched out printed circuit boards, maintaining the arrangement of the remaining part of the material panel and the printed circuit boards during further processing for fitting with components, soldering, etc. One disadvantage of this arrangement is that the material panel is not fully utilized and the work panel frame produced at the same time must be scrapped after component assembly, a costly requirement.

Another method is also known, this involving the use of metal frames to carry the printed circuit boards, e.g., from the equipment stations to soldering stations, etc. This method is, however, also fairly costly, and, significantly, impedes uniform handling and storage due to non-uniform dimensions of such structures.

Printed circuit board assemblies (those having two or more boards) may also be used for multi-purpose applications (work panels) in which all boards function cooperatively to accomplish several purposes. All boards in such an arrangement must obviously function properly. Failure of one board can result in costly repair or replacement operations. It is believed, therefore, that a substrate handling device capable of overcoming the aforementioned and other disadvantages associated with known devices would constitute a significant advancement in the art.

DISCLOSURE OF THE INVENTION

A primary object of the present invention is, therefore, to provide a device for carrying a plurality of circuitized substrates (e.g., printed circuit boards) that is readily easy to utilize and relatively inexpensive to produce.

Another object of the invention is to provide a substrate handling device which is of relatively simplistic configuration, yet which is fully capable of positively securing a plurality of substrates thereto (e.g., for transport and subsequent processing).

In accordance with one aspect of the invention, there is provided a circuitized assembly comprising a carrier member including a plurality of first locking features, and a plurality of circuitized substrates secured to the carrier member and each including at least one second locking feature, each of the second locking features engaging a respective one of the first locking features of the carrier member in a locking form of engagement to positively retain the circuitized substrates within the carrier member.

According to another aspect of the invention, there is provided a method of making a circuitized substrate assembly comprising the steps of providing a carrier member having a plurality of first locking features, providing a plurality of circuitized substrates, each including at least two second locking features, and positioning each of the circuitized substrates within the carrier member such that each of the second locking features frictionally engages a respective one of the first locking features.

The method as taught herein provides a substantial improvement in utilization of the assembled structure and hence offers a more cost-effective solution. In addition, it is substantially easier to exchange faulty boards with good boards, thereby substantially reducing scrap.

BEST MODE FOR CARRYING OUT THE INVENTION

Figure 1:
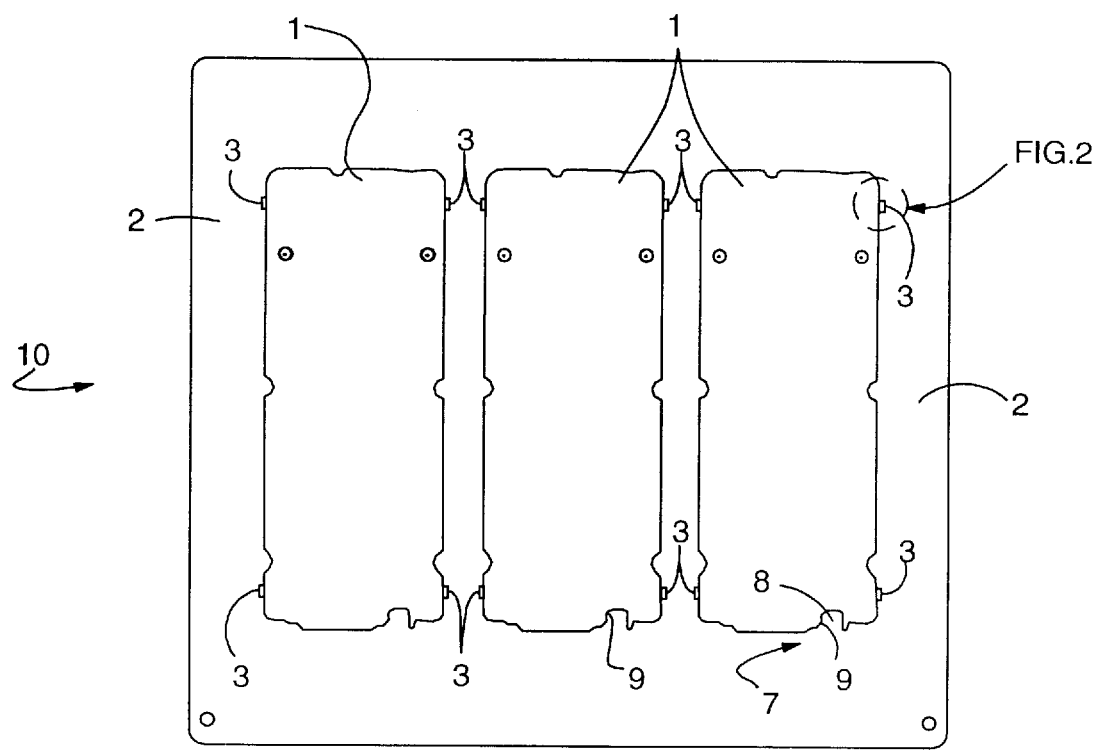
FIG. 1 is a plan view of an assembly having a plurality of circuitized substrates (e.g., printed circuit boards) held thereby, in accordance with one embodiment of the invention.

According to the invention, substrates such as printed circuit boards are produced and tested in individual board size for the relevant production usage. As FIG. 1 shows, a plurality of good boards 1 can be fitted so that these fit exactly into a printed circuit board carrier (frame) 2, e.g., for subsequent processing and/or shipment to a customer who chooses to perform such processing. Examples of such processing include solder attach (e.g., wave soldering) followed by electronic component assembly.

The result as taught herein is, therefore, a circuitized substrate assembly 10 wherein several (e.g., three, although the invention is not limited thereto) circuitized substrates (e.g., printed circuit boards 1 of conventional dielectric material, a preferred example being fiberglass-reinforced epoxy resin) are positively retained within the rectangular-shaped carrier 2 using frictional engagement.

Each substrate, also of rectangular shape, preferably includes two locking features 3 along each of its two opposing, longitudinal sides. A total of four features 3 are thus provided, although more or less are possible, including one feature 3 along each of the substrate's four sides. Keying means 7, in the form of a protruding tab 8 on carrier 2 for each substrate which mates with a respective slot 9 in each substrate, assures proper substrate orientation within the carrier as is of course necessary if the invention is to eventually be precisely aligned within subsequent processing equipment (e.g., for component attach).

Figure 2:
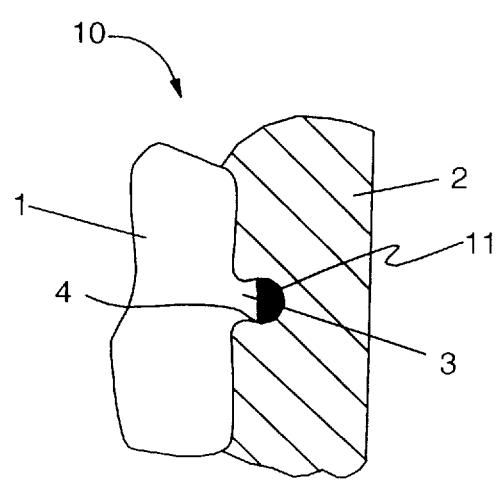
FIG. 2 is a much enlarged, partial view, of the assembly of FIG. 1 illustrating one example of the interlocking relationship between device carrier and substrate.

As seen in FIG. 2, a preferred locking feature 3 in a projecting male projection (tab) which frictionally engages a respective female slot 4. Substrate retention is thus attainable without clips, clamps, or other external mechanical members. That is, the carrier and substrate members alone assure proper positioning of the assembled members.

As an initial step of the method as per the invention, the several printed circuit boards are produced using known methods. After producing the layout for the individual boards and the photo-masks, the cores for each are then manufactured.

Once the polymer resist has been produced by lamination, desired holes are drilled, which, when plated, interlink the individual conductive planes (levels). This is followed by the plating (with copper) and the printed circuit conductive paths (or lines) are then produced by a conventional photo-process. After the printed circuit boards have been subjected to electrical test, the boards are then cut from the large panel in which several have been simultaneously formed.

In parallel with the manufacture of the printed circuit boards, the method of the invention then provides for the manufacture of the printed circuit board carrier 2. Once the layout has been produced for this carrier, the carrier's raw material is then cut out.

The carrier is thus produced with material thereof cut out (e.g., if plastic) or provided as a casting (if metal), according to the precise size of the printed circuit boards to be inserted.

In a preferred form of construction of the invention, the printed circuit board carrier is comprised of a recyclable material, such as temperature-resistant plastic or similar material. Yet another acceptable material for the carrier as indicated is metal, e.g., steel. One advantage of using similar materials is that elongation of the printed circuit board and the printed circuit board carrier, e.g., during high temperature soldering operations, is similar. In addition, such plastic material is cost-effective and its disposal is environmentally friendly. As stated, it is also possible for the printed circuit board carrier to be made of metal, so that it can then be returned to the manufacturer after assembly of the printed circuit boards. In addition, the printed circuit board carrier can be made of waste preimpregnated board which can then ultimately be scrapped.

As a final stage, the individual printed circuit boards are inserted in the frame so that the locking features 3 and 4 frictionally engage respective ones of each other (specifically, one first feature 4 is designed for having one, respective second locking feature 3 inserted therein). As FIG. 2 shows, board positioning can be enhanced by bonding the boards, for example, with an optional adhesive 11.

An even more secured positioning is also possible, however, using external clamps, clips, or the like (not shown), albeit such external mechanical members have been found not necessary for satisfactory exposure of the invention to known processing steps.

Once the individual boards have been adjusted in the frame, the entire assembly, comprised of the printed circuit board carrier and the printed circuit boards adjusted inside can be passed on for assembly (component mounting) of the printed circuit boards, and other processing (e.g., wave soldering). After the assembly and other processes, the individual boards may then be removed from the frame and the frame reused with other printed circuit boards. As understood, cutting is not then needed to satisfactorily remove the boards from carrier 2.

The invention therefore enables simple exchange of faulty boards without cutting or unclipping, thus substantially reducing waste while assuring a final structure of relatively simple and inexpensive construction.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate assembly comprising:
   (a) a plurality of substantially planar circuitized substrates, each substrate having a first side, opposing second and third sides, a fourth side opposite the first side, a top, and a bottom;
   (b) a carrier supporting the plurality of substrates;
   (c) an alignment mechanism including a slot in the first side of each substrate and a plurality of tabs on the carrier adapted to engage the respective slots in the first sides of the substrates, the alignment mechanism aligning each substrate with respect to the carrier; and
   (d) a locking mechanism, separate from the alignment mechanism, including at least one pair of male projections disposed on the opposing second and third sides of each substrate and a plurality of female retaining members in the carrier adapted to frictionally engage the respective projections on the opposing second and third sides of the substrates, the locking mechanism locking each substrate with respect to the carrier.

2. The circuitized substrate assembly of claim 1 wherein said carrier is comprised of recyclable material.

3. The circuitized substrate assembly of claim 2 wherein said recyclable material is comprised of plastic.

4. The circuitized substrate assembly of claim 1 wherein said carrier is comprised of metal and each of said circuitized substrates is comprised of dielectric material.

5. The circuitized substrate assembly of claim 4 wherein said dielectric material is fiberglass-reinforced epoxy resin.

6. The circuitized substrate assembly of claim 1 wherein said plurality of circuitized substrates are secured to said carrier without the use of clips, clamps or other members.

7. The circuitized substrate assembly of claim 1 further comprising means for independently releasing at least one of the circuitized substrates while positively retaining the remainder of the circuitized substrates.

8. The circuitized substrate assembly of claim 1 wherein the locking mechanism has two pairs of male projections.

9. The circuitized substrate assembly of claim 1 wherein each of the substrates is oriented within the carrier to be aligned within subsequent processing equipment.

* * * * *